United States Patent
Davis et al.

(10) Patent No.: US 7,371,306 B2
(45) Date of Patent: *May 13, 2008

(54) INTEGRATED TOOL WITH INTERCHANGEABLE WET PROCESSING COMPONENTS FOR PROCESSING MICROFEATURE WORKPIECES

(75) Inventors: Jeffry Alan Davis, Kalispell, MT (US); Randy A. Harris, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 256 days.

This patent is subject to a terminal disclaimer.

(21) Appl. No.: 10/860,593

(22) Filed: Jun. 3, 2004

(65) Prior Publication Data

US 2005/0061438 A1 Mar. 24, 2005

Related U.S. Application Data

(60) Provisional application No. 60/501,566, filed on Sep. 9, 2003, provisional application No. 60/476,881, filed on Jun. 6, 2003, provisional application No. 60/476,333, filed on Jun. 6, 2003, provisional application No. 60/476,786, filed on Jun. 6, 2003, provisional application No. 60/476,666, filed on Jun. 5, 2003.

(51) Int. Cl.
*C23F 1/00* (2006.01)
*C25D 17/00* (2006.01)

(52) U.S. Cl. .......................... 156/345.22; 156/345.31; 156/345.32; 204/198

(58) Field of Classification Search ........... 156/345.31, 156/345.32
See application file for complete search history.

(56) References Cited

U.S. PATENT DOCUMENTS

| | | |
|---|---|---|
| 3,652,442 A | 3/1972 | Powers et al. |
| 4,428,814 A | 1/1984 | Chen |
| 4,466,864 A | 8/1984 | Bacon |
| 4,648,774 A | 3/1987 | Dorumsgaard et al. |
| 4,749,601 A | 6/1988 | Hillinger |
| 4,868,575 A | 9/1989 | Mok et al. |

(Continued)

FOREIGN PATENT DOCUMENTS

EP 0 343 502 A2 11/1989

(Continued)

OTHER PUBLICATIONS

Wu, Bill (Qunwei) et al., "Methods for Characterization of Mass Transfer Boundary Layer in an Industrial Semiconductor Wafer Plating Cell," Abs. 165, 205th Meeting, The Electrochemical Society, Inc. (2000).

(Continued)

*Primary Examiner*—Karla A. Moore
(74) *Attorney, Agent, or Firm*—Perkins Coie LLP

(57) ABSTRACT

An integrated tool that enables wet chemical processing chambers, lift-rotate units and other hardware to be quickly interchanged without having to recalibrate the transport system or other components to the replacement items. These tools are expected to reduce the down time associated with repairing or maintaining processing chambers and/or lift-rotate units so that the tools can maintain a high throughput. Several aspects of these tools are particularly useful for applications that have stringent performance requirements because components are more likely to require maintenance more frequently, and reducing the down time associated with maintaining such components will significantly enhance the integrated tool.

32 Claims, 8 Drawing Sheets

U.S. PATENT DOCUMENTS

| | | | |
|---|---|---|---|
| 4,917,421 A | 4/1990 | Wightman et al. | |
| 4,937,998 A | 7/1990 | Goldberg | |
| 5,000,827 A | 3/1991 | Schuster | |
| 5,222,310 A | 6/1993 | Thompson et al. | |
| 5,230,743 A | 7/1993 | Thompson et al. | |
| 5,284,554 A | 2/1994 | Datta | |
| 5,312,532 A | 5/1994 | Andricacos | |
| 5,344,491 A | 9/1994 | Katou | |
| 5,344,539 A | 9/1994 | Shinogi | |
| 5,402,807 A | 4/1995 | Moore et al. | |
| 5,421,987 A | 6/1995 | Tzanavaras | |
| 5,431,421 A | 7/1995 | Thompson | |
| 5,476,577 A | 12/1995 | May | |
| 5,486,282 A | 1/1996 | Datta | |
| 5,516,412 A | 5/1996 | Andricacos | |
| 5,531,874 A | 7/1996 | Brophy | |
| 5,536,388 A | 7/1996 | Dinan | |
| 5,543,032 A | 8/1996 | Datta | |
| 5,567,300 A | 10/1996 | Datta | |
| 5,614,076 A | 3/1997 | Brophy | |
| 5,635,157 A | 6/1997 | Mease et al. | |
| 5,683,564 A | 11/1997 | Reynolds | |
| 5,733,024 A * | 3/1998 | Slocum et al. | 312/223.2 |
| 5,762,751 A | 6/1998 | Bleck | |
| 5,865,984 A | 2/1999 | Corbin, Jr. | |
| 5,925,226 A | 7/1999 | Hurwitt | |
| 6,001,235 A | 12/1999 | Arken | |
| 6,004,440 A | 12/1999 | Hanson | |
| 6,024,856 A | 2/2000 | Haydu | |
| 6,027,631 A | 2/2000 | Broadbent | |
| 6,035,804 A | 3/2000 | Arami et al. | |
| 6,037,790 A | 3/2000 | Dinan | |
| 6,042,712 A | 3/2000 | Mathieu | |
| 6,048,154 A | 4/2000 | Wylman | |
| 6,082,948 A | 7/2000 | Fishkin et al. | |
| 6,103,096 A | 8/2000 | Datta | |
| 6,132,586 A | 10/2000 | Adams | |
| 6,136,163 A | 10/2000 | Cheung | |
| 6,139,703 A | 10/2000 | Hanson et al. | |
| 6,168,695 B1 | 1/2001 | Woodruff | |
| 6,181,057 B1 | 1/2001 | Inoue et al. | |
| 6,197,182 B1 | 3/2001 | Kaufman | |
| 6,214,193 B1 | 4/2001 | Reid | |
| 6,228,231 B1 | 5/2001 | Uzoh | |
| 6,231,743 B1 | 5/2001 | Etherington | |
| 6,251,250 B1 | 6/2001 | Keigler | |
| 6,312,522 B1 * | 11/2001 | Dinh et al. | 118/407 |
| 6,322,674 B1 | 11/2001 | Berner | |
| 6,328,872 B1 | 12/2001 | Talieh et al. | |
| 6,379,511 B1 | 4/2002 | Fatula et al. | |
| 6,391,114 B1 | 5/2002 | Kirimura et al. | |
| 6,436,267 B1 | 8/2002 | Carl et al. | |
| 6,454,918 B1 | 9/2002 | Sakaki | |
| 6,478,937 B2 | 11/2002 | Olgado et al. | |
| 6,482,300 B2 | 11/2002 | Sakaki | |
| 6,547,937 B1 | 4/2003 | Oberlitner | |
| 6,565,622 B1 | 5/2003 | Mailhan et al. | |
| 6,585,876 B2 | 7/2003 | Dordi | |
| 6,635,157 B2 | 10/2003 | Dordi et al. | |
| 6,660,137 B2 | 12/2003 | Wilson et al. | |
| 6,672,820 B1 | 1/2004 | Hanson | |
| 6,773,559 B2 | 8/2004 | Woodruff et al. | |
| 6,875,333 B2 | 4/2005 | Sakaki et al. | |
| 6,897,372 B2 | 5/2005 | Jimenez | |
| 6,921,467 B2 | 7/2005 | Hanson et al. | |
| 6,955,747 B2 | 10/2005 | Browne et al. | |
| 7,018,517 B2 | 3/2006 | Kurita et al. | |
| 7,198,694 B2 * | 4/2007 | Woodruff et al. | 156/345.31 |
| 7,247,223 B2 | 7/2007 | McHugh et al. | |
| 2001/0032788 A1 * | 10/2001 | Woodruff et al. | 205/687 |
| 2002/0000380 A1 | 1/2002 | Graham et al. | |
| 2002/0088708 A1 | 7/2002 | Sakaki | |
| 2003/0038035 A1 | 2/2003 | Wilson et al. | |
| 2003/0221953 A1 | 12/2003 | Oberlitner | |
| 2004/0134774 A1 | 7/2004 | Woodruff et al. | |
| 2005/0000817 A1 | 1/2005 | McHugh et al. | |
| 2005/0006241 A1 | 1/2005 | McHugh et al. | |
| 2005/0034977 A1 | 2/2005 | Hanson et al. | |
| 2005/0035046 A1 | 2/2005 | Hanson et al. | |
| 2005/0063798 A1 | 3/2005 | Davis et al. | |
| 2005/0145499 A1 | 7/2005 | Kovarsky et al. | |
| 2005/0167275 A1 | 8/2005 | Keigler et al. | |

FOREIGN PATENT DOCUMENTS

| | | |
|---|---|---|
| EP | 0 726 698 A2 | 8/1996 |
| EP | 0881673 | 12/1998 |
| JP | 62-297494 | 12/1987 |
| JP | 62297495 | 12/1987 |
| JP | 1120827 | 5/1989 |
| JP | 05175158 | 7/1993 |
| JP | 06260468 | 9/1994 |
| JP | 07211724 | 8/1995 |
| JP | 07284738 | 10/1995 |
| JP | 09-089067 | 3/1997 |
| JP | 10172974 | 6/1998 |
| JP | 11092993 | 4/1999 |
| JP | 2000017480 | 1/2000 |
| JP | 20011064795 | 3/2001 |
| WO | WO-99/25004 | 5/1999 |
| WO | WO-01/00173 | 1/2001 |
| WO | WO-01/50505 A3 | 7/2001 |
| WO | WO-04/110698 A2 | 12/2004 |
| WO | WO-05/042804 A2 | 5/2005 |

OTHER PUBLICATIONS

Tacken, R.A. et al., "Applications of Magnetoelectrolysis", Journal of Applied Electrochemistry, 1995 (no month), vol. 25, pp. 1-5.

* cited by examiner

INTEGRATED TOOL WITH INTERCHANGEABLE WET PROCESSING COMPONENTS FOR PROCESSING MICROFEATURE WORKPIECES

CROSS-REFERENCE TO RELATED APPLICATIONS

The present application claims the benefit of U.S. Application No. 60/476,786 filed on Jun. 6, 2003 and 60/476,666 filed on Jun. 5, 2003, both of which are incorporated herein in their entirety, including appendices, by reference. Additionally, U.S. Application No. 60/476,333 filed on Jun. 6, 2003; 60/476,881 filed on Jun. 6, 2003; and 60/501,566 filed on Sep. 9, 2003, are also incorporated herein in their entirety, including appendices, by reference.

TECHNICAL FIELD

The present invention is directed toward apparatus and methods for processing microfeature workpieces having a plurality of microdevices integrated in and/or on the workpiece. The microdevices can include submicron features. Particular aspects of the present invention are directed toward a tool having a dimensionally stable mounting module that provides a precise reference frame to interchange processing cells or robotic handling equipment without recalibrating the system.

BACKGROUND

Microdevices are manufactured by depositing and working several layers of materials on a single substrate to produce a large number of individual devices. For example, layers of photoresist, conductive materials, and dielectric materials are deposited, patterned, developed, etched, planarized, and otherwise manipulated to form features in and/or on a substrate. The features are arranged to form integrated circuits, micro-fluidic systems, and other structures.

Wet chemical processes are commonly used to form features on microfeature workpieces. Wet chemical processes are generally performed in wet chemical processing tools that have a plurality of individual processing chambers for cleaning, etching, electrochemically depositing materials, or performing combinations of these processes. FIG. 1 schematically illustrates an integrated tool 10 that can perform one or more wet chemical processes. The tool 10 includes a housing or cabinet 20 having a platform 22, a plurality of wet chemical processing chambers 30 in the cabinet 20, and a transport system 40. The tool 10 also includes lift-rotate units 32 coupled to each processing chamber 30 for loading/unloading the workpieces W. The processing chambers 30 can be rinse/dry chambers, cleaning capsules, etching capsules, electrochemical deposition chambers, or other types of wet chemical processing vessels. The transport system 40 includes a linear track 42 and a robot 44 that moves along the track 42 to transport individual workpieces W within the tool 10. The integrated tool 10 further includes a workpiece storage unit 60 having a plurality of containers 62 for holding workpieces W. In operation, the robot 44 transports workpieces to/from the containers 62 and the processing chambers 30 according to a predetermined workflow within the tool 10.

One concern of integrated wet chemical processing tools is that the processing chambers must be maintained and/or repaired periodically. In electrochemical deposition chambers, for example, consumable electrodes degrade over time because the reaction between the electrodes and the electrolytic solution decomposes the electrodes. The shape of consumable electrodes accordingly changes causing variations in the electrical field. As a result, consumable electrodes must be replaced periodically to maintain the desired deposition parameters across the workpiece. The electrical contacts that contact the workpiece also may need to be cleaned or replaced periodically. To maintain or repair electrochemical deposition chambers, they are typically removed from the tool 10 and replaced with an extra chamber.

One problem with repairing or maintaining existing wet chemical processing chambers is that the tool must be taken offline for an extended period of time to remove and replace the processing chambers 30 from the tool 10. When the processing chamber 30 is removed from the tool 10, a pre-maintained processing chamber 30 is mounted to the platform 22 at the vacant station, and then the robot 44 and the lift-rotate unit 32 are recalibrated to operate with the new processing chamber. Recalibrating the robot 44 and the lift-rotate unit 32 is a time-consuming process that increases the downtime for repairing or maintaining processing chambers. As a result, when only one processing chamber 30 of the tool 10 does not meet specifications, it is often more efficient to continue operating the tool 10 without stopping to repair the one processing chamber 30 until more processing chambers do not meet the performance specifications. The loss of throughput of a single processing chamber 30, therefore, is not as severe as the loss of throughput caused by taking the tool 10 offline to repair or maintain a single one of the processing chambers 30.

The practice of operating the tool 10 until at least two processing chambers 30 do not meet specifications severely impacts the throughput of the tool 10. For example, if the tool 10 is not repaired or maintained until at least two or three processing chambers 30 are out of specification, then the tool operates at only a fraction of its full capacity for a period of time before it is taken offline for maintenance. This increases the operating costs of the tool 10 because the throughput not only suffers while the tool 10 is offline to replace the wet processing chambers 30 and recalibrate the robot 44, but the throughput is also reduced while the tool is online because it operates at only a fraction of its full capacity. Moreover, as the feature sizes decrease, the electrochemical deposition chambers 30 must consistently meet much higher performance specifications. This causes the processing chambers 30 to fall out of specifications sooner, which results in shutting down the tool more frequently. Therefore, the downtime associated with repairing and/or maintaining electrochemical deposition chambers and other types of wet chemical processing chambers is significantly increasing the cost of operating wet chemical processing tools.

SUMMARY

The present invention is directed toward an integrated tool that enables wet chemical processing chambers, lift-rotate units and other hardware to be quickly interchanged without having to recalibrate the transport system or other components of the tool. This is expected to reduce the down time associated with repairing or maintaining processing chambers and/or lift-rotate units so that the tool can remain online for a larger percentage of available operating time. Moreover, reducing the downtime for maintenance makes it more economical to repair each chamber as needed instead of waiting for two or more chambers to fall out of specifications. Several aspects of the invention are particularly useful for applications that have stringent performance requirements because the processing chambers are likely to require maintenance more frequently, and reducing the down time associated with frequently maintaining such components will significantly enhance the throughput of the integrated tool.

One embodiment of an integrated tool for wet chemical processing of microfeature workpieces includes a frame, a mounting module carried by the frame, a wet chemical processing chamber carried by the mounting module, and a transport system carried by the mounting module. The mounting module includes a plurality of positioning elements and attachment elements. In one embodiment, the mounting module is configured to maintain relative positions between the positioning elements to within a range that does not require the transport system to be recalibrated when the processing chamber is replaced for repair or maintenance. The mounting module, for example, can include a deck having a rigid outer panel, a rigid interior panel juxtaposed to the outer panel, and joists or other types of bracing between the outer and interior panels. The outer panel, the bracing and the interior panel are fastened together to create a structure that does not deflect, warp or otherwise change its dimension to maintain the relative positions between the positioning elements on the deck.

The wet chemical processing chamber has a first interface member engaged with one of the positioning elements and a first fastener engaged with one of the attachment elements. Similarly, the transport system has a second interface member engaged with one of the positioning elements and a second fastener engaged with one of the attachment elements. By engaging the interface members of the processing chamber and the transport system with positioning elements of the mounting module, the wet chemical processing chamber and the transport system are precisely located at known locations on the mounting module. Moreover, because the mounting module is dimensionally stable, the relative position between the wet chemical processing chamber and the transport system can be consistently maintained after replacing one wet chemical processing chamber with another. These two aspects of the tool enable the transport system to transport workpieces to/from the processing chambers without having to recalibrate the transport system each time a processing chamber is removed and replaced for maintenance.

DETAILED DESCRIPTION

As used herein, the terms "microfeature workpiece" or "workpiece" refer to substrates on or in which microelectronic devices are formed integrally. Typical microdevices include microelectronic circuits or components, thin-film recording heads, data storage elements, microfluidic devices, and other products. Micromachines or micromechanical devices are included within this definition because they are manufactured using much of the same technology that is used in the fabrication of integrated circuits. The substrates can be semiconductive pieces (e.g., doped silicon wafers or gallium arsenide wafers), nonconductive pieces (e.g., various ceramic substrates), or conductive pieces.

Several embodiments of integrated tools for wet chemical processing of microfeature workpieces are described in the context of depositing metals or electrophoretic resist in or on structures of a workpiece. The integrated tools in accordance with the invention, however, can also be used in etching, rinsing or other types of wet chemical processes in the fabrication of microfeatures in and/or on semiconductor substrates or other types of workpieces. Several embodiments of tools in accordance with the invention are set forth in FIGS. 2A-8 and the following text provide a thorough understanding of particular embodiments of the invention. The description is divided into the following sections: (A) Embodiments of Integrated Tools With Mounting Modules; (B) Embodiments of Dimensionally Stable Mounting Modules; (C) Embodiments of Wet Chemical Processing Chambers; and (D) Embodiments of Lift-Rotate Units and Load/Unload Modules. A person skilled in the art will understand, however, that the invention may have additional embodiments, or that the invention may be practiced without several of the details of the embodiments shown in FIGS. 2A-8.

A. Embodiments of Integrated Tools With Mounting Modules

Figure 1:
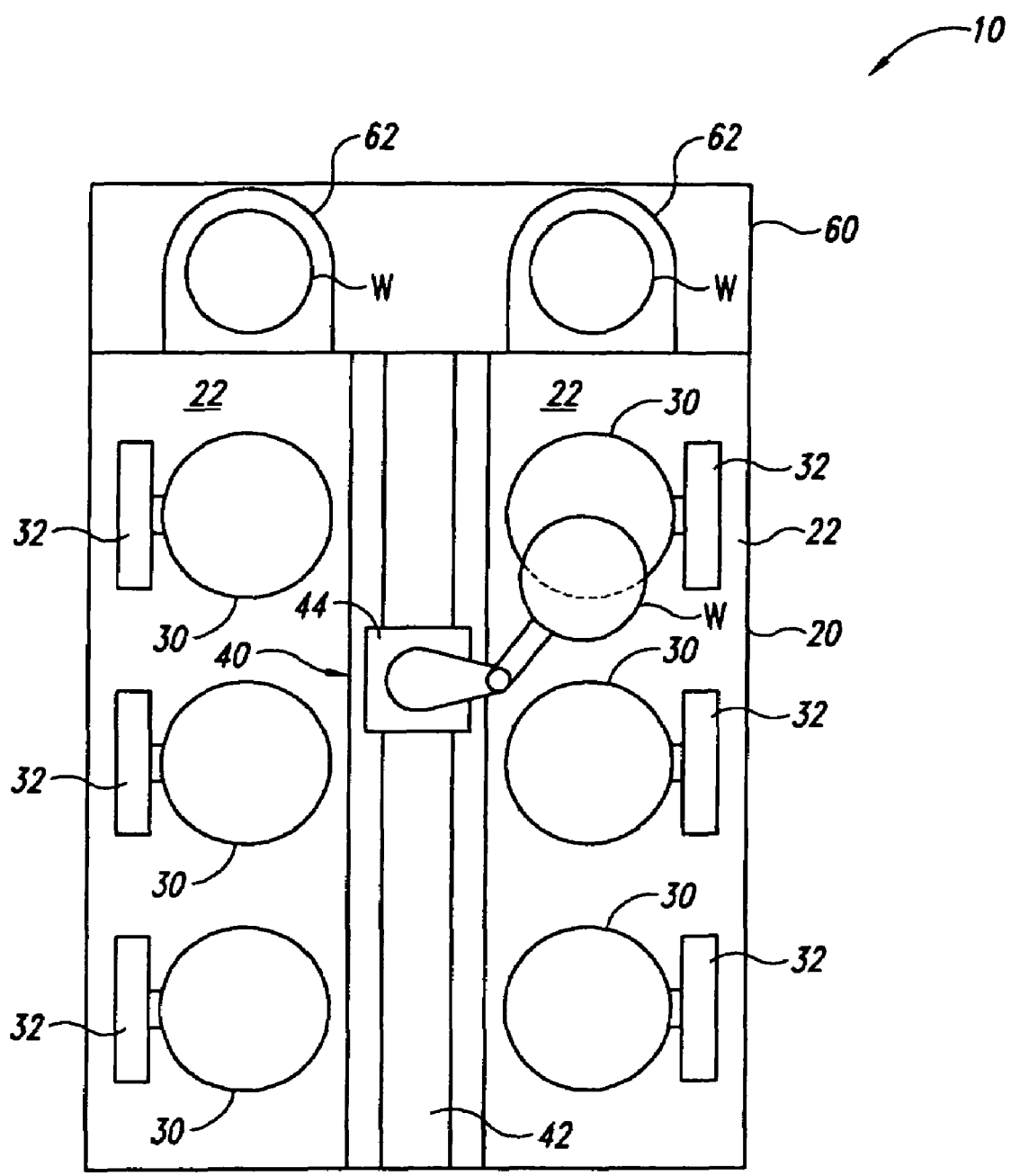
FIG. 1 is a schematic top plan view of a wet chemical processing tool in accordance with the prior art.
Figure 2A:
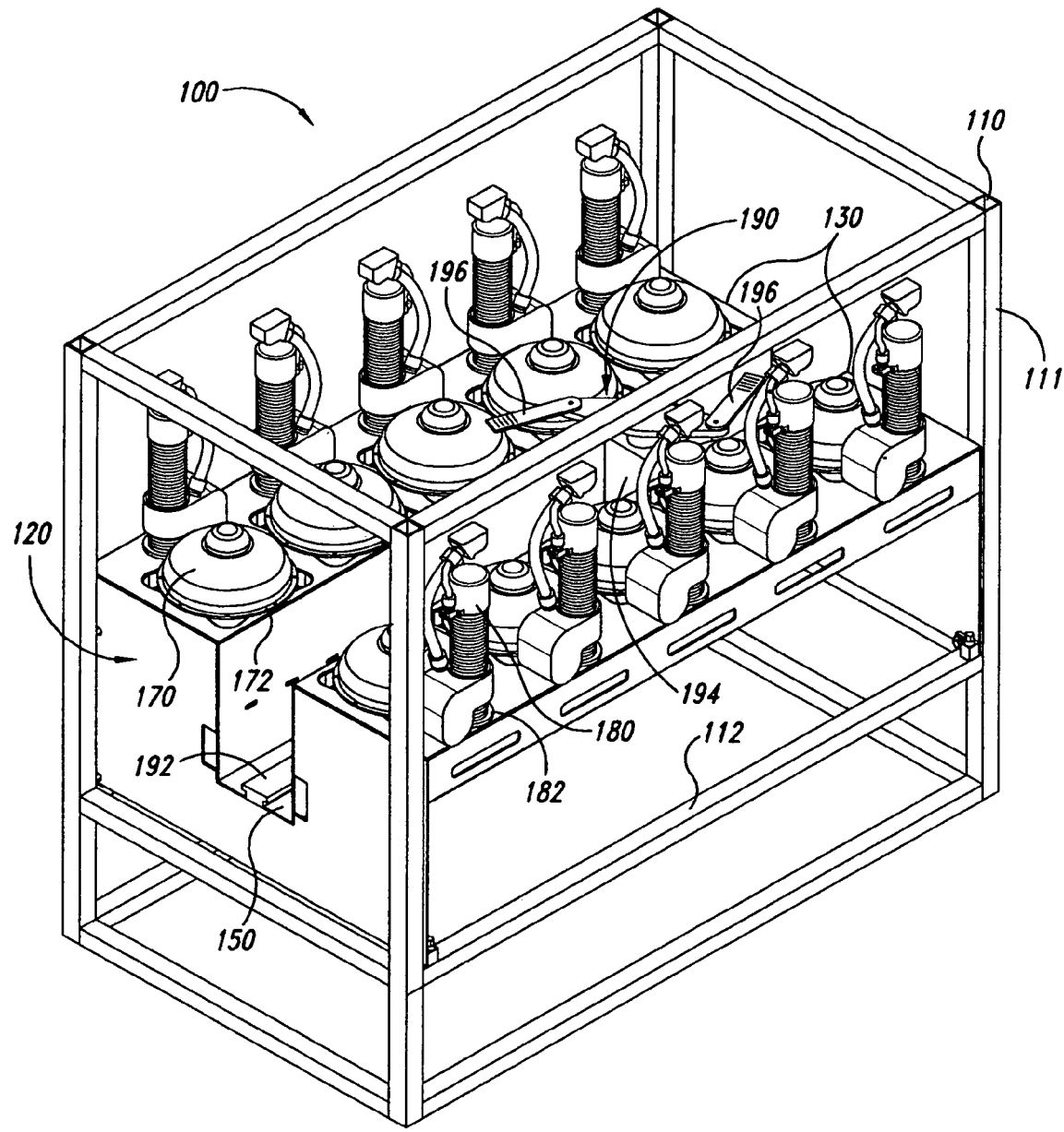
FIG. 2A is an isometric view illustrating a portion of a wet chemical processing tool in accordance with one embodiment of the invention.

FIG. 2A is an isometric view showing a portion of an integrated tool 100 in accordance with an embodiment of the invention. In this embodiment, the integrated tool 100 includes a frame 110, a dimensionally stable mounting module 120 mounted to the frame 110, a plurality of wet chemical processing chambers 170, and a plurality of lift-rotate units 180. The tool 100 can also include a transport system 190. The mounting module 120 carries the processing chambers 170, the lift-rotate units 180, and the transport system 190.

The frame 110 has a plurality of posts 111 and cross-bars 112 that are welded together in a manner known in the art. A plurality of outer panels and doors (not shown in FIG. 2A) are generally attached to the frame 110 to form an enclosed cabinet. The mounting module 120 is at least partially housed within the frame 110. In one embodiment, the mounting module 120 is carried by cross-bars 112 of the frame 110, but the mounting module 120 can stand directly on the floor of the facility or other structures in other embodiments.

The mounting module 120 is a rigid, stable structure that maintains the relative positions between the wet chemical processing chambers 170, the lift-rotate units 180, and the transport system 190. One aspect of the mounting module 120 is that it is much more rigid and has a significantly greater structural integrity compared to the frame 110 so that the relative positions between the wet chemical processing chambers 170, the lift-rotate units 180, and the transport system 190 do not change over time. Another aspect of the mounting module 120 is that it includes a dimensionally stable deck 130 with positioning elements at precise locations for positioning the processing chambers 130 and the lift-rotate units 180 at known locations on the deck 130. In one embodiment (not shown), the transport system 190 can be mounted directly to the deck 130. In other embodiments, the mounting module 120 also has a dimensionally stable platform 150 and the transport system 190 is mounted to the platform 150. The deck 130 and the platform 150 are fixedly positioned relative to each other so that positioning elements on the deck 130 and positioning elements on the platform 150 do not move relative to each other. The mounting module 120 accordingly provides a system in which wet chemical processing chambers 170 and lift-rotate units 180 can be removed and replaced with interchangeable components in a manner that accurately positions the replacement components at precise locations on the deck 130.

The tool 100 is particularly suitable for applications that have demanding specifications which require frequent maintenance of the wet chemical processing chambers 170, the lift-rotate units 180, or the transport system 190. A wet chemical processing chamber 170 can be repaired or maintained by simply detaching the chamber from the processing deck 130 and replacing the chamber 170 with an interchangeable chamber having mounting hardware configured to interface with the positioning elements on the deck 130. Because the mounting module 120 is dimensionally stable and the mounting hardware of the replacement processing chamber 170 interfaces with the deck 130, the chambers 170 can be interchanged on the deck 130 without having to recalibrate the transport system 190. This is expected to significantly reduce the downtime associated with repairing or maintaining processing chambers 170 so that the tool can maintain a high throughput in applications that have stringent performance specifications.

Figure 2B:
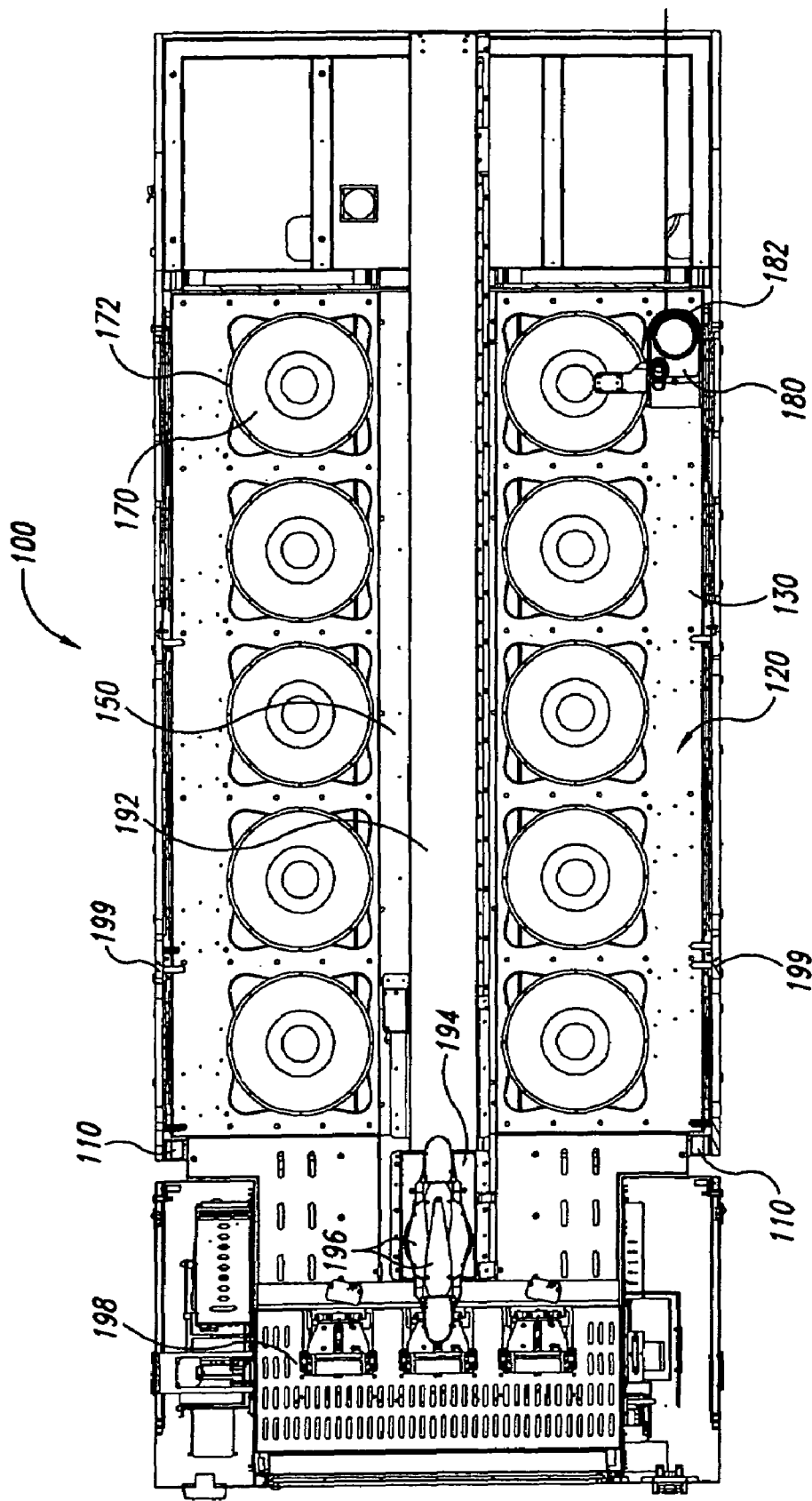
FIG. 2B is a top plan view of a wet chemical processing tool in accordance with an embodiment of the invention.

FIG. 2B is a top plan view of the tool 100 illustrating the transport system 190 and a load/unload module 198 attached to the mounting module 120. Referring to FIGS. 2A and 2B together, the transport system 190 includes a track 192, a robot 194, and at least one end-effector 196. The track 192 is mounted to the platform 150 in the embodiment shown in FIGS. 2A and 2B. More specifically, the track 192 interfaces with positioning elements on the platform 150 to accurately position the track 192 relative to the chambers 170 and the lift-rotate units 180 attached to the deck 130. The robot 194 and end-effectors 196 can accordingly move in a fixed, dimensionally stable reference frame established by the mounting module 120. Referring to FIG. 2B, the tool 100 can further include a plurality of panels 199 attached to the frame 110 to enclose the mounting module 120, the wet chemical processing chambers 170, the lift-rotate units 180, and the transport system 190 in a cabinet. In other embodiments, the panels 199 on one or both sides of the tool 100 can be removed in the region above the processing deck 130 to provide an open tool.

B. Embodiments of Dimensionally Stable Mounting Modules

Figure 3:
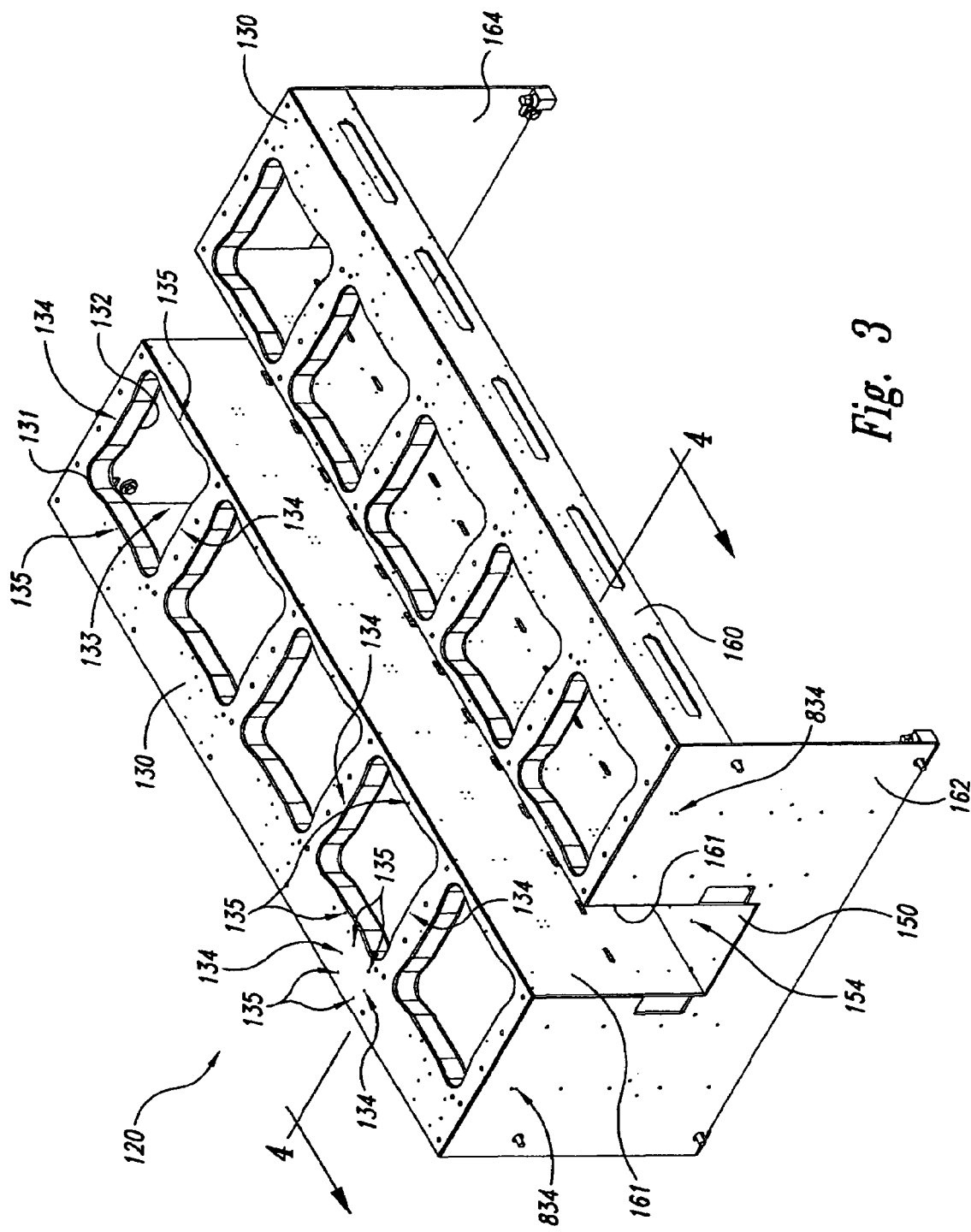
FIG. 3 is an isometric view of a mounting module for use in a wet chemical processing tool in accordance with an embodiment of the invention.

FIG. 3 is an isometric view of a mounting module 120 in accordance with an embodiment of the invention for use in the tool 100. In this embodiment, the deck 130 includes a rigid first panel 131 and a rigid second panel 132 superimposed underneath the first panel 131. The first panel 131 can be an outer member and the second panel 132 can be an interior member juxtaposed to the outer member. The first and second panels 131 and 132 can also have different configurations than the configuration in FIG. 3. A plurality of chamber receptacles 133 are disposed in the first and second panels 131 and 132 to receive the wet chemical processing chambers 170 (FIG. 2A).

The deck 130 can further include a plurality of positioning elements 134 and attachment elements 135 arranged in a precise pattern across the first panel 131. The positioning elements 134 can be holes machined in the first panel 131 at precise locations and/or dowels or pins received in the holes. The dowels are also configured to interface with the wet chemical processing chambers 170 (FIG. 2A). In other embodiments, the positioning elements 134 can be pins, such as cylindrical pins or conical pins, that project upwardly from the first panel 131 without being positioned in holes in the first panel 131. The deck 130 has a first set of positioning elements 134 located at each chamber receptacle 133 to accurately position the individual wet chemical processing chambers at precise locations on the mounting module 120. The deck 130 can also include a second set of positioning elements 134 near each receptacle 133 to accurately position individual lift-rotate units 180 at precise locations on the mounting module 120. The attachment elements 135 can be threaded holes in the first panel 131 that receive bolts to secure the chambers 170 and the lift-rotate units 180 to the deck 130.

The mounting module 120 also includes exterior side plates 160 along longitudinal outer edges of the deck 130, interior side plates 161 along longitudinal inner edges of the deck 130, and endplates 162 and 164 attached to the ends of the deck 130. The transport platform 150 is attached to the interior side plates 161 and the end plates 162 and 164. The transport platform 150 includes positioning elements 152 for accurately positioning the track 192 (FIGS. 2A and 2B) of the transport system 190 on the mounting module 120. The transport platform 150 can further include attachment elements, such as tapped holes, that receive bolts to secure the track 192 to the platform 150.

Figure 4:
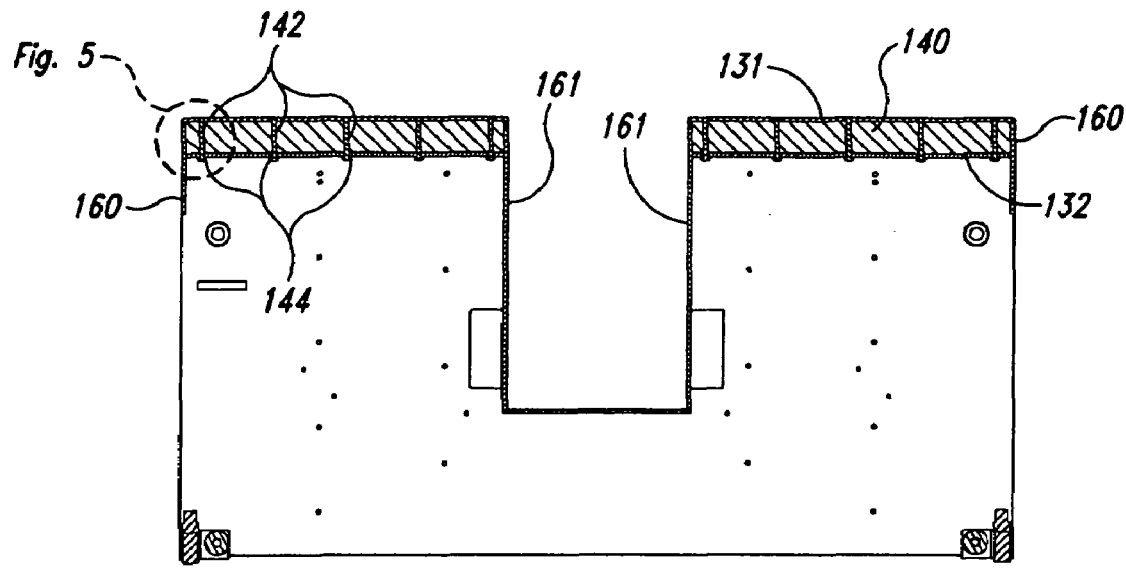
FIG. 4 is a cross-sectional view along line 4-4 of FIG. 3 of a mounting module for use in a wet chemical processing tool in accordance with an embodiment of the invention.
Figure 5:
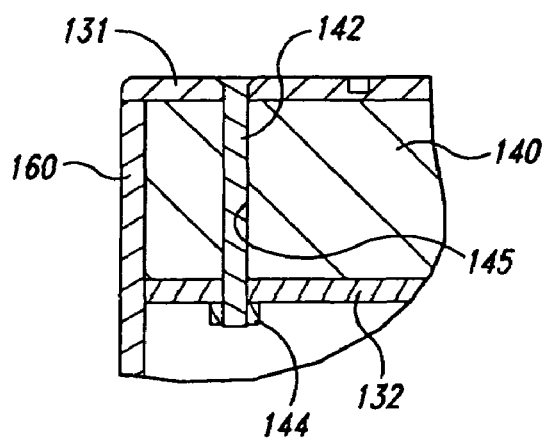
FIG. 5 is a cross-sectional view showing a portion of a deck of a mounting module in greater detail.

FIG. 4 is a cross-sectional view illustrating one suitable embodiment of the internal structure of the deck 130, and FIG. 5 is a detailed view of a portion of the deck shown in FIG. 4. In this embodiment, the deck 130 includes bracing 140, such as joists, extending laterally between the exterior side plates 160 and the interior side plates 161. The first panel 131 is attached to the upper side of the bracing 140, and the second panel 132 is attached to the lower side of the bracing 140. The deck 130 can further include a plurality of throughbolts 142 and nuts 144 that secure the first and second panels 131 and 132 to the bracing 140. As best shown in FIG. 5, the bracing 140 has a plurality of holes 145 through which the throughbolts 142 extend. The nuts 144 can be welded to the bolts 142 to enhance the connection between these components.

The panels and bracing of the deck 130 can be made from stainless steel, other metal alloys, solid cast materials, or fiber-reinforced composites. For example, the panels and plates can be made from Nitronic 50 stainless steel, Hastelloy 625 steel alloys, or a solid cast epoxy filled with mica.

The fiber-reinforced composites can include a carbon-fiber or Kevlar® mesh in a hardened resin. The material for the panels 131 and 132 should be highly rigid and compatible with the chemicals used in the wet chemical processes. Stainless steel is well-suited for many applications because it is strong but not affected by many of the electrolytic solutions or cleaning solutions used in wet chemical processes. In one embodiment, the panels and plates 131, 132, 160, 161, 162 and 164 are 0.125 to 0.375 inch thick stainless steel, and more specifically they can be 0.250 inch thick stainless steel. The panels and plates, however, can have different thickness in other embodiments.

The bracing 140 can also be stainless steel, fiber-reinforced composite materials, other metal alloys, and/or solid cast materials. In one embodiment, the bracing can be 0.5 to 2.0 inch wide stainless steel joists, and more specifically 1.0 inch wide by 2.0 inches tall stainless steel joists. In other embodiments the bracing 140 can be a honey-comb core or other structures made from metal (e.g., stainless steel, aluminum, titanium, etc.), polymers, fiber glass or other materials.

The mounting module 120 is constructed by assembling the sections of the deck 130, and then welding or otherwise adhering the end plates 162 and 164 to the sections of the deck 130. The components of the deck 130 are generally secured together by the throughbolts 142 without welds. The outer side plates 160 and the interior side plates 161 are attached to the deck 130 and the end plates 162 and 164 using welds and/or fasteners. The platform 150 is then securely attached to the end plates 162 and 164, and the interior side plates 161. The order in which the mounting module 120 is assembled can have several different embodiments and is not limited to the procedure explained above.

The mounting module 120 provides a heavy-duty, dimensionally stable structure that maintains the relative positions between the positioning elements 134 on the deck 130 and the positioning elements 152 on the platform 150 within a range that does not require the transport system 190 to be recalibrated each time a replacement processing chamber 170 or lift-rotate unit 180 is mounted to the deck 130. The mounting module 120 is generally a rigid structure that is sufficiently strong to maintain the relative positions between the positioning elements 134 and 152 when the wet chemical processing chambers 170, the lift-rotate units 180, and the transport system 190 are mounted to the mounting module 120. In several embodiments, the mounting module 120 is configured to maintain the relative positions between the positioning elements 134 and 152 to within 0.025 inch. In other embodiments, the mounting module is configured to maintain the relative positions between the positioning elements 134 and 152 to within approximately 0.005 to 0.015 inch. As such, the deck 130 often maintains a uniformly flat surface to within approximately 0.025 inch, and in more specific embodiments to approximately 0.005-0.015 inch.

C. Embodiments of Wet Chemical Processing Chambers

Figure 6:
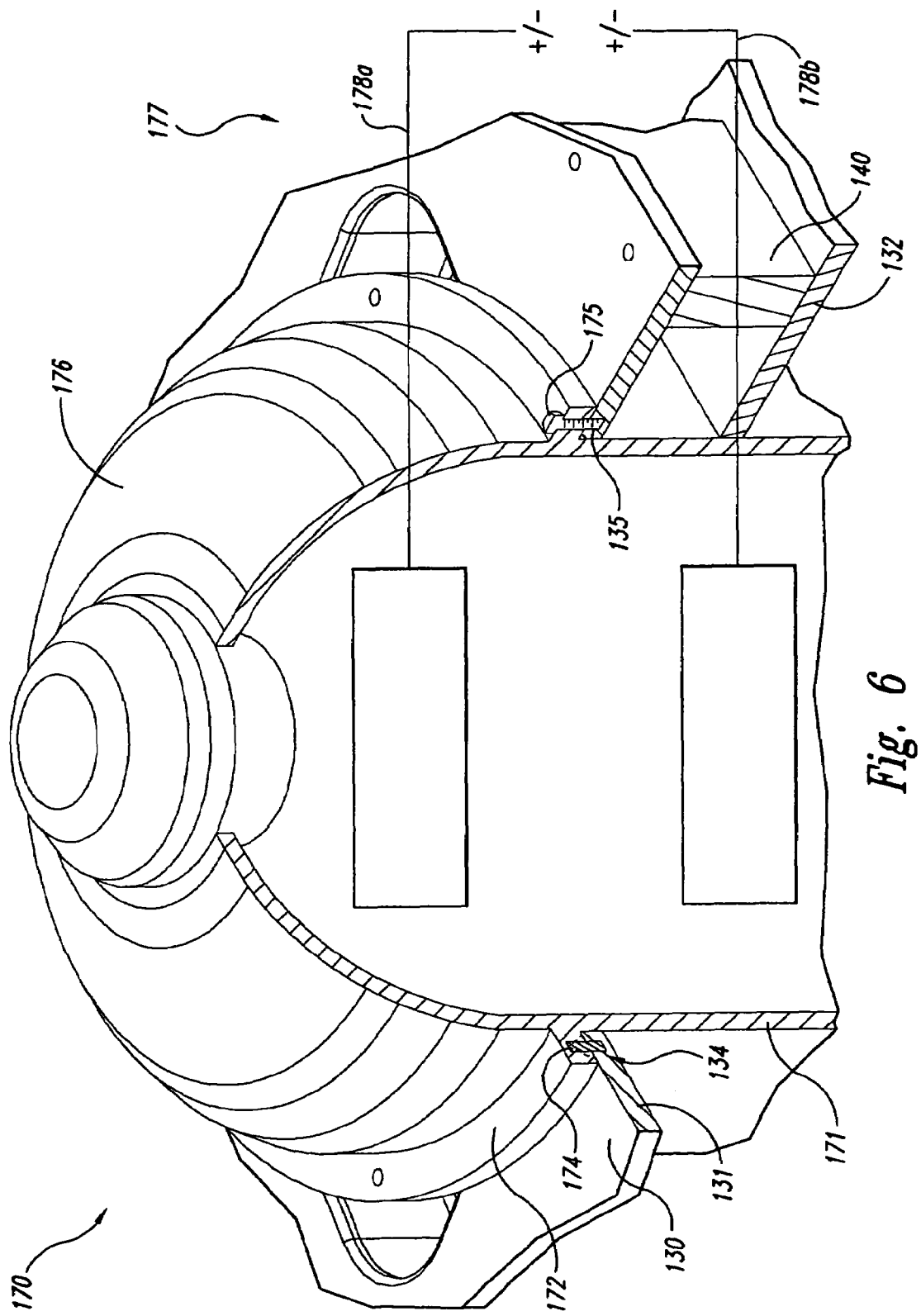
FIG. 6 is a cross-sectional isometric view schematically illustrating an electrochemical deposition chamber for use in the wet chemical processing tool in accordance with an embodiment of the invention.

FIG. 6 is an isometric cross-sectional view showing the interface between a wet chemical processing chamber 170 and the deck 130. The chamber 170 can include a processing vessel 171 and a collar 172. The processing vessel 171 can be formed from a polymeric material or other material that is compatible with the chemicals used in the wet chemical process. In many applications, the processing vessel 171 is composed of a high density polymer that does not react with the electrolytic solution, cleaning solution, or other type of fluid used in the chamber 170. The collar 172 and the vessel 171 can be separate components that are connected together. In such cases, the collar 172 can be made from a dimensionally stable material, such as stainless steel, fiber-reinforced materials, steel alloys, cast solid materials, or other suitably rigid materials. In other embodiments, the collar 172 is integral with the vessel 171 and formed from a high-density polymer or other suitable material.

The collar 172 includes a plurality of interface members 174 that are arranged in a pattern to be aligned with the positioning elements 134 on the deck 130. The positioning elements 134 and the interface members 174 are also configured to mate with one another to precisely position the collar 172, and thus the chamber 170, at a desired operating location on the deck 130 to work with lift-rotate unit 180 and the transport system 190. The positioning elements 134 can be a set of precisely machined holes in the deck 130 and dowels received in the holes, and the interface members 174 can be holes precisely machined in the collar 172 to mate with the dowels. The dowels can be pins with cylindrical, spherical, conical or other suitable shapes to align and position the collar 172 at a precise location relative to the deck 130. The collar 172 can further include a plurality of fasteners 175 arranged to be aligned with the attachment elements 135 in the deck 130. The fasteners 175 can be bolts or other threaded members that securely engage the attachment elements 135 to secure the collar 172 to the deck 130. The collar 172 accordingly holds the processing vessel 171 at a fixed, precise location on the deck.

The wet chemical processing chambers 170 can be electrochemical deposition chambers, spin-rinse-dry chambers, cleaning capsules, etching chambers, or other suitable wet chemical processing stations. The chamber 170 illustrated in FIG. 6 is an electrochemical deposition chamber having a head 176 with a workpiece holder to position a workpiece in the vessel 171. The chamber 170 shown in FIG. 6 also has an electrical system 177 having a first electrode 178a configured to contact the workpiece and a second electrode 178b disposed in the vessel 171. The first and second electrodes 178a and 178b establish an electrical field to plate ions in an electrolytic solution onto the workpiece. It will be appreciated that the electrochemical processing chamber 170 can be an electroless chamber that does not include the electrical system 177. Suitable electrochemical deposition chambers are disclosed in U.S. application Ser. Nos. 09/804,696; 09/804,697; 10/234,637; 10/234,982; 10/234,628; 10/234,442; 09/849,505; 09/866,391; 09/866,463; 09/875,365; 09/872,151; and 10/295,302, all of which are herein incorporated by reference in their entirety. In other embodiments, the wet chemical processing chambers can be capsules or other types of chambers for cleaning wafers, such as those shown in U.S. Pat. Nos. 6,350,319; 6,423,642; and 6,413,436, all of which are also herein incorporated by reference in their entirety.

The tool 100 can include various combinations of wet chemical processing chambers 170. For example, all of the chambers can be of a common type (e.g., electrochemical deposition chambers, cleaning chambers, etching chambers, etc.), or various combinations of different types of chambers can be mounted to the deck 130 of the tool 100. Suitable combinations of wet chemical processing chambers 170 and workpiece transport systems 190 are disclosed in the references incorporated above and U.S. patent application Ser. Nos. 09/875,300; 09/875,428; and 10/080,910, all of which are herein incorporated by reference.

D. Embodiments of Lift Rotate Units and Load/Unload Modules

Figure 7:
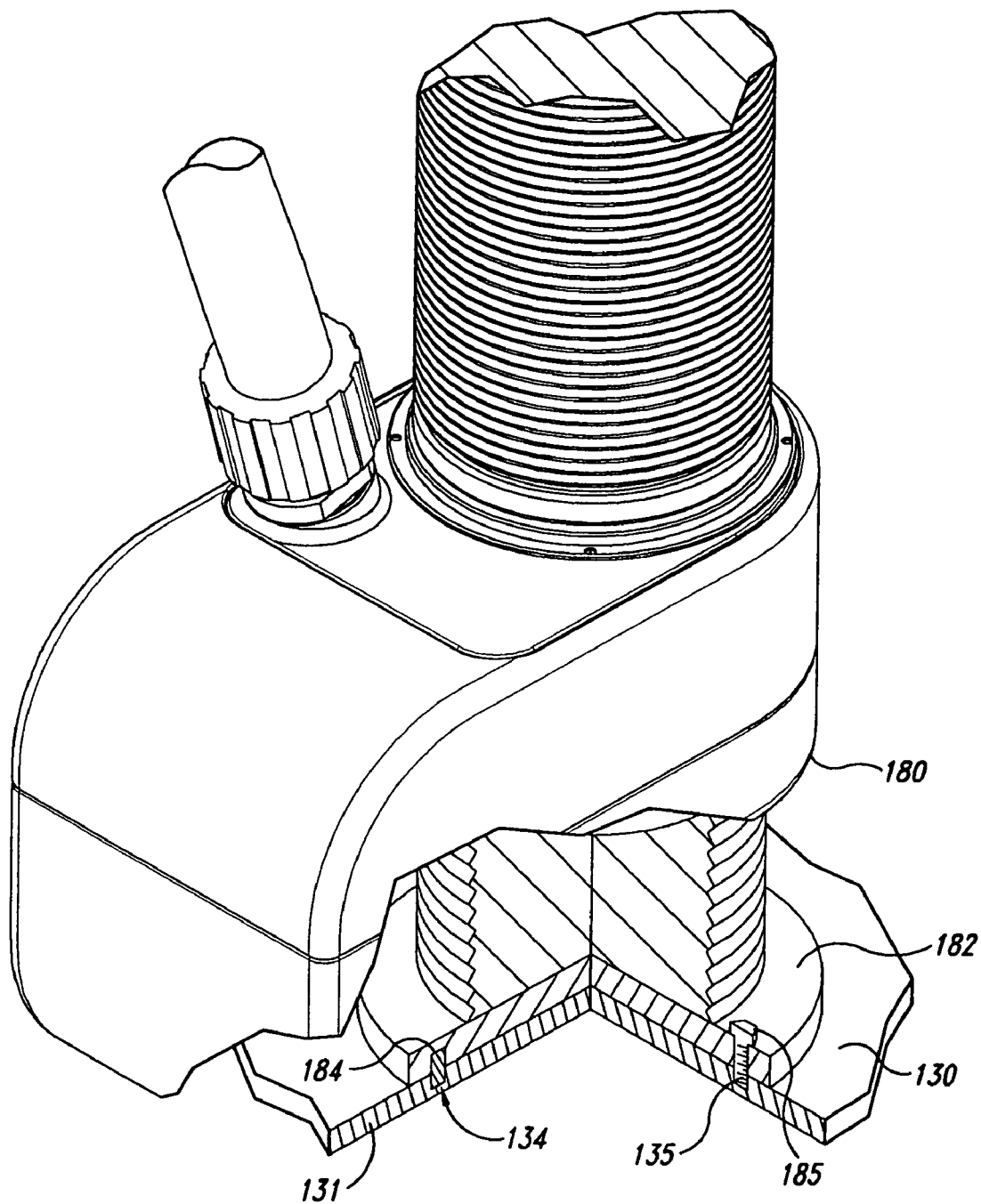
FIG. 7 is a cross-sectional isometric view of a lift-rotate unit for operating the head of wet chemical processing chambers in accordance with an embodiment of the invention.

FIG. 7 is an isometric cross-sectional view showing an embodiment of a lift-rotate unit 180 attached to the deck 130. In this embodiment, the lift-rotate unit 180 includes a dimensionally stable collar 182. The collar 182 includes a plurality of interface members 174 arranged in a pattern to be aligned with the positioning elements 134 when the lift-rotate unit 180 is positioned at the desired location for operating the head 176 of the chamber 170 (FIG. 6). The lift-rotate unit 180 can further include a plurality of fasteners 185 arranged in the collar 182 to be aligned with attachment elements 135 in the deck 130 for mounting the lift-rotate unit 180 to the mounting module 120. The interface elements 184, positioning elements 134, fasteners 185, and attachment elements 135 can have similar or identical structures as described above with reference to FIG. 6.

Figure 8:
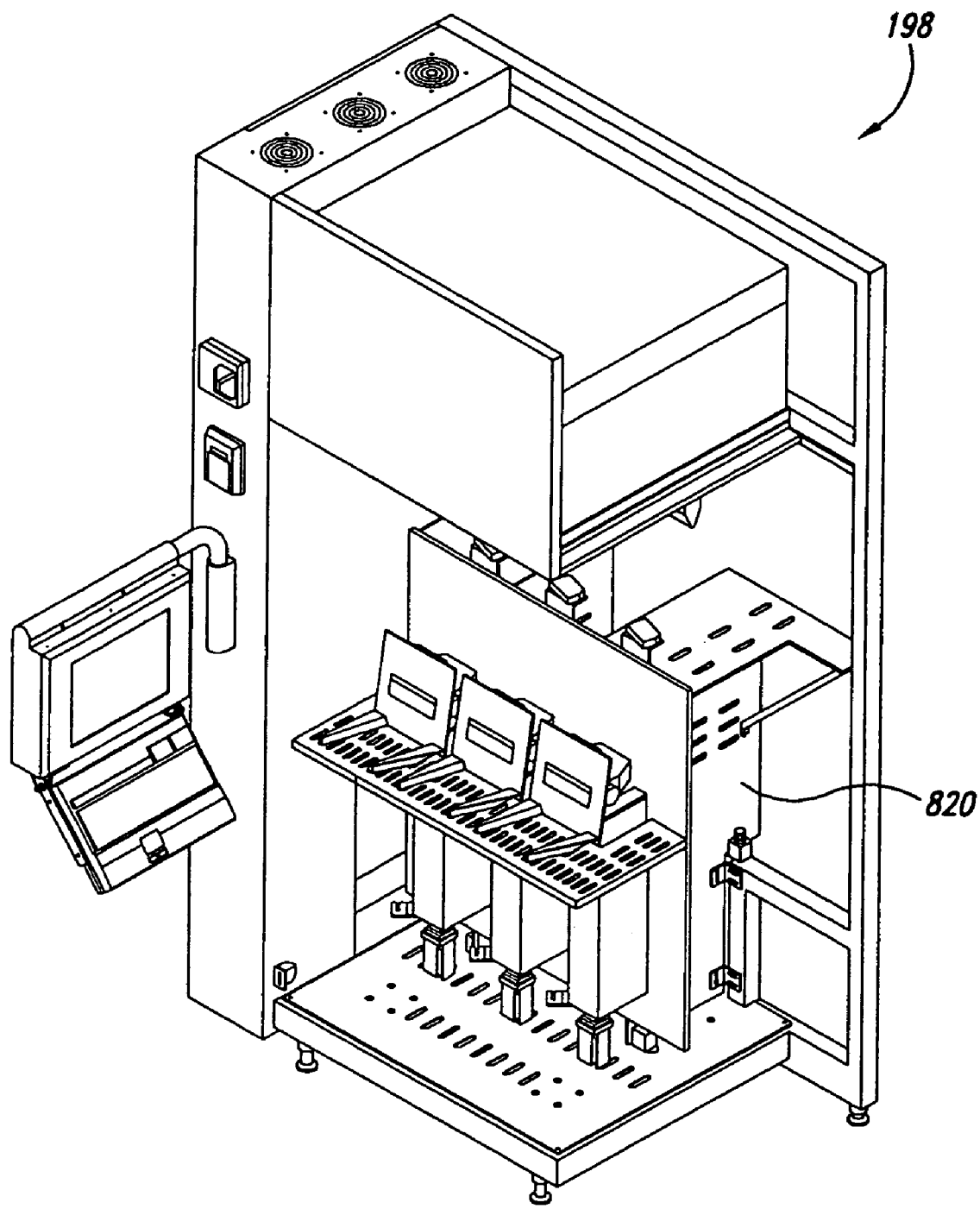
FIG. 8 is an isometric view of a loading/unloading module for use with the mounting module in accordance with an embodiment of the invention.

FIG. 8 is an isometric view of a load/unload module 198 for holding workpieces before and after being processed in the chambers 170. The load/unload module 198 has a dimensionally stable structure 820 that can be formed from stainless steel, other steel alloys, or other highly dimensionally stable materials in a manner similar to the mounting module 120 described above. Referring to FIGS. 3 and 8 together, the structure 820 can include interface members (not shown) arranged to be aligned with precision elements 834 (FIG. 3) on the end plate 162 of the mounting module 120 when the load/unload module 198 is properly positioned for operation. The structures of the interface members on the structure 820 and the positioning elements 834 on the end plate 162 can be similar to those described above with reference to FIG. 6. The load/unload module 198 can accordingly be positioned accurately relative to the transport system 190 without having to recalibrate the transport system 190 each time the load/unload module 198 is attached to the tool 100.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An integrated tool for wet chemical processing of microfeature workpieces, comprising:
   a mounting module having a plurality of positioning elements and attachment elements;
   a wet chemical processing chamber having a first interface member engaged with one of the positioning elements and a first fastener engaged with one of the attachment elements, wherein a lower portion of the processing chamber is below the first interface member and is located within the mounting module;
   a transport system carried by the mounting module for transporting workpieces within the tool, the transport system having a second interface member engaged with one of the positioning elements and a second fastener engaged with one of the attachment elements; and
   wherein the mounting module is configured to maintain relative positions between positioning elements such that the transport system does not need to be recalibrated when the processing chamber is replaced with another processing chamber.

2. The tool of claim 1 wherein the mounting module includes a deck comprising:
   a rigid outer member, wherein a plurality of the positioning elements and a plurality of the attachment elements are on the outer member;
   a rigid interior member juxtaposed to the outer member;
   bracing between the outer member and the interior member, wherein the outer member, the bracing, and the interior member are fastened together; and
   wherein the wet chemical processing chamber is attached to the deck.

3. The tool of claim 1 wherein the mounting module includes a deck comprising:
   a rigid first panel, wherein a plurality of the positioning elements and a plurality of the attachment elements are on the first panel;
   a rigid second panel juxtaposed to the first panel;
   braces between the first and second panels, wherein the first panel, the braces and the second panel are fastened together to be dimensionally stable; and
   wherein the wet chemical processing chamber is attached to the deck.

4. The tool of claim 1 wherein the mounting module includes a deck comprising:
   a plurality of joists;
   a rigid first panel attached to one side of the joists and having a plurality of (a) the positioning elements and (b) the attachment elements;
   a rigid second panel juxtaposed to the first panel and attached to another side of the joists; and
   wherein the wet chemical processing chamber is attached to first panel of the deck.

5. The tool of claim 4 wherein the first panel, the second panel and the joists comprise stainless steel.

6. The tool of claim 4 wherein the first panel, the second panel and the joists comprise a fiber reinforced material.

7. The tool of claim 1 wherein the mounting module further comprises:
   a processing deck comprising an upper panel having a plurality of (a) the positioning elements and (b) the attachment elements, braces attached to the upper panel, a lower panel under the upper panel and attached to the braces, and a chamber opening in the lower panel and the upper panel, wherein the first interface member of the wet chemical processing chamber is engaged with a corresponding positioning element of the upper panel of the processing deck, and wherein a portion of the chamber is in the chamber opening; and
   a platform having a plurality of the positioning elements and being fixedly disposed in the tool relative to the processing deck, and wherein the second interface member of the workpiece transport mechanism is engaged with a corresponding positioning element of the platform.

8. The tool of claim 7 wherein the upper panel, the lower panel and the platform comprise stainless steel.

9. The tool of claim 7 wherein the upper panel, the lower panel and the platform comprise a fiber reinforced material.

10. The tool of claim 1 wherein the mounting module comprises a deck for carrying the wet chemical processing chamber, a platform for carrying the transport system, and adjustable footings for adjustably attaching the mounting module to the frame, and wherein:
   the deck comprises a plurality of joists, a rigid first panel attached to one side of the joists and having a first set of the positioning elements and a first set of the attachment elements, a rigid second panel juxtaposed to the first panel and attached to another side of the joists, and a chamber opening through the first panel and the second panel;

the platform comprises a second set of positioning elements and a second set of attachment elements;

the wet chemical processing station is at least partially located in the chamber opening and includes a plurality of first interface members and a plurality of first fasteners, and the first interface members being engaged with corresponding positioning elements of the first set of positioning elements and the first fasteners being engaged with corresponding attachment elements of the first set of attachment elements; and the transport system is carried by the platform and includes a plurality of second interface members and a plurality of second fasteners, and the second interface members being engaged with corresponding positioning elements of the second set of positioning elements and the second fasteners being engaged with corresponding attachments elements of the second set of attachment elements.

11. The tool of claim 10 wherein the wet chemical processing chamber comprises an electrochemical deposition chamber having a vessel, a first electrode in the vessel, a workpiece holder disposed relative to the vessel to hold a workpiece in a processing solution, and a second electrode carried by the workpiece holder to engage a workpiece.

12. The tool of claim 10 wherein the wet chemical processing chamber comprises a cleaning chamber having a fluid delivery system that directs a cleaning fluid onto a workpiece.

13. The tool of claim 10 wherein:

the wet chemical processing chamber is a first electrochemical deposition chamber comprising a first vessel, a first workpiece holder disposed relative to the first vessel to hold a workpiece in a processing solution, a first cathodic electrode disposed in one of the first vessel or the first workpiece holder, and a first anodic electrode disposed in the other of the first vessel or the first workpiece holder; and the tool further comprises a second electrochemical deposition chamber comprising a second vessel, a second workpiece holder disposed relative to the second vessel to hold a workpiece in a processing solution, a second cathodic electrode disposed in one of the second vessel or the second workpiece holder, and a second anodic electrode disposed in the other of the second vessel or the second workpiece holder.

14. The tool of claim 10 wherein the wet chemical processing chamber comprises an electrochemical deposition chamber having a vessel, a first electrode in the vessel, a workpiece holder disposed relative to the vessel to hold a workpiece in a processing solution, and a second electrode carried by the workpiece holder to engage a workpiece.

15. The tool of claim 10 wherein the wet chemical processing chamber comprises a cleaning chamber having a fluid delivery system that directs a cleaning fluid onto a workpiece.

16. The tool of claim 10 wherein:

the wet chemical processing chamber is a first electrochemical deposition chamber comprising a first vessel, a first workpiece holder disposed relative to the first vessel to hold a workpiece in a processing solution, a first cathodic electrode disposed in one of the first vessel or the first workpiece holder, and a first anodic electrode disposed in the other of the first vessel or the first workpiece holder; and the tool further includes a second wet chemical processing chamber comprising a cleaning chamber having a fluid delivery system that directs a cleaning fluid onto a workpiece.

17. The tool of claim 10 wherein the mounting module is configured to maintain relative positions between the positioning elements to within 0.025 inch.

18. The tool of claim 10 wherein the mounting module is configured to maintain relative positions between the positioning elements to within approximately 0.005 to 0.015 inch.

19. An integrated tool for wet chemical processing of microfeature workpieces, comprising:

a mounting module comprising a deck having a rigid outer member with a plurality of positioning elements and a plurality of attachment elements, a rigid interior member juxtaposed to the outer member, and bracing between the outer member and the interior member, wherein the outer member, the bracing and the interior member are fixed together to be dimensionally stable;

a wet chemical processing station attached to the deck, the wet chemical processing station having a vessel including a first interface member engaged with at least one of the positioning elements and a first fastener engaged with an attachment element, and wherein a portion of the vessel is below the deck and within the mounting module; and a workpiece transport system attached to the mounting module.

20. The tool of claim 19 wherein the outer member is superimposed over the interior member, and the deck further comprises a plurality of bolts clamping the outer member to one side of the bracing the clamping the interior member to another side of the bracing.

21. The tool of claim 19 wherein the bracing comprises horizontal joists, the outer member comprises a rigid top panel attached to a top side of the joists, the interior member comprises a bottom panel superimposed under the top panel and attached to an underside of the joists, and the deck further comprises a plurality of bolts extending through the bracing to clamp the top panel and the bottom panel to the joists.

22. The tool of claim 21 wherein the top panel, the joists, and the bottom panel are configured to maintain relative positions between the positioning elements across the top panel to within 0.025 inch.

23. The tool of claim 21 wherein the top panel, the joists and the bottom panel are configured to maintain relative positions between the positioning elements across the top panel to within 0.010 inch.

24. The tool of claim 21 wherein the top panel comprises stainless steel.

25. The tool of claim 21 wherein the top panel comprises a fiber reinforce composite.

26. An integrated tool for wet chemical processing of microfeature workpieces, comprising:

a mounting module comprising a deck having a first rigid panel with a plurality of positioning elements and a plurality of attachment elements, a second rigid panel superimposed under the first rigid panel, an opening in the first and second rigid panels, and braces between the first and second rigid panels, wherein the first panel, the braces and the second panel are fixed together to be dimensionally stable;

a wet chemical processing station attached to the deck and at least partially positioned in the opening, the wet chemical processing station having a first interface member engaged with at least one of the positioning elements and a first fastener engaged with an attachment element; and a workpiece transport system attached to the mounting module.

27. The tool of claim 26 wherein the first panel comprises stainless steel.

28. The tool of claim 26 wherein the first panel comprises a fiber reinforced composite.

29. The tool of claim 26 wherein:

the first interface member of the wet chemical processing chamber is engaged with a corresponding positioning element of the first panel of the deck; and the mounting module further comprises a platform having a plurality of the positioning elements and being fixedly disposed in the tool relative to the deck, and wherein the second interface member of the workpiece transport mechanism is engaged with a corresponding positioning element of the platform.

30. The tool of claim 26 wherein:

the braces comprise a plurality of joists, the rigid first panel is attached to one side of the joists and has a first set of the positioning elements and a first set of the attachment elements, and the rigid second panel is juxtaposed to the first panel and attached to another side of the joists;

the mounting module further comprises a platform including a second set of positioning elements and a second set of attachment elements;

the wet chemical processing station is carried by the deck and includes a plurality of first interface members and a plurality of first fasteners, and the first interface members being engaged with corresponding positioning elements of the first set of positioning elements and the first fasteners being engaged with corresponding attachment elements of the first set of attachment elements; and the transport system is carried by the platform and includes a plurality of second interface members and a plurality of second fasteners, and the second interface members being engaged with corresponding positioning elements of the second set of positioning elements and the second fasteners being engaged with corresponding attachments elements of the second set of attachment elements.

31. The tool of claim 30 wherein the wet chemical processing chamber comprises an electrochemical deposition chamber having a vessel, a first electrode in the vessel, a workpiece holder disposed relative to the vessel to hold a workpiece in a processing solution, and a second electrode carried by the workpiece holder to engage a workpiece.

32. The tool of claim 30 wherein the wet chemical processing chamber comprises a cleaning chamber having a fluid delivery system that directs a cleaning fluid onto a workpiece.

* * * * *